(12) United States Patent
Weigand et al.

(10) Patent No.: US 9,538,636 B1
(45) Date of Patent: Jan. 3, 2017

(54) BLIND VIA EDGE CASTELLATION

(71) Applicant: MACOM Technology Solutions Holdings, Inc., Lowell, MA (US)

(72) Inventors: Christopher D. Weigand, Andover, MA (US); Andrzej Rozbicki, Santa Clara, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 632 days.

(21) Appl. No.: 13/803,081

(22) Filed: Mar. 14, 2013

(51) Int. Cl.
*H05K 1/02* (2006.01)
*H05K 1/14* (2006.01)
*H05K 1/18* (2006.01)
*H05K 1/03* (2006.01)
*H05K 3/00* (2006.01)
*H05K 3/42* (2006.01)

(52) U.S. Cl.
CPC .......... *H05K 1/0237* (2013.01); *H05K 1/0298* (2013.01); *H05K 1/0306* (2013.01); *H05K 1/14* (2013.01); *H05K 1/181* (2013.01); *H05K 3/0094* (2013.01); *H05K 3/429* (2013.01); *H05K 1/0201* (2013.01); *H05K 1/18* (2013.01)

(58) Field of Classification Search
CPC .. H05K 1/0237; H05K 3/0094; H05K 1/0298; H05K 1/0306; H05K 1/0251; H05K 3/403; H05K 3/421; H05K 2201/09518; H05K 1/0201; H05K 1/112; H05K 1/117; H05K 1/14; H05K 1/144; H05K 1/18; H05K 1/181; H05K 1/182
USPC ......... 174/250–268; 361/760–766, 792–795; 257/778
See application file for complete search history.

(56) References Cited

U.S. PATENT DOCUMENTS

| | | | | |
|---|---|---|---|---|
| 4,551,746 A * | 11/1985 | Gilbert | ............... | H01L 23/057 257/691 |
| 4,821,007 A * | 4/1989 | Fields | ............... | H01P 3/085 174/266 |
| 5,191,174 A * | 3/1993 | Chang | ............... | H05K 1/115 174/266 |
| 5,471,368 A * | 11/1995 | Downie | ............... | H05K 1/141 174/263 |
| 6,469,255 B2 * | 10/2002 | Watanabe | ......... | H01L 23/49805 174/254 |
| 6,571,469 B2 * | 6/2003 | Okada | ............... | H01L 21/4853 257/E23.061 |
| 6,778,043 B2 * | 8/2004 | Stoddard | ............. | H05K 1/0233 174/266 |
| 6,862,190 B2 * | 3/2005 | Olzak | ............... | H05K 1/141 174/262 |
| 7,385,144 B2 * | 6/2008 | Hash | ............... | H05K 3/366 174/255 |
| 7,897,880 B1 * | 3/2011 | Goergen | ............. | H05K 1/0237 174/261 |

(Continued)

*Primary Examiner* — Ishwarbhai B Patel
(74) *Attorney, Agent, or Firm* — Christopher P. Maiorana, PC (57) ABSTRACT

An apparatus having a plurality of insulating layers, a plurality of conductive layers and a plating is disclosed. The conductive layers may be separated by the insulating layers. A first pattern in a first of the conductive layers generally extends to an edge castellation. A second pattern in a second of the conductive layers may also extends to the edge castellation. The plating may be disposed in the edge castellation and connect the first pattern to the second pattern. The plating in the castellation may extend at most between a subset of the conductive layers.

29 Claims, 6 Drawing Sheets

(56) References Cited

U.S. PATENT DOCUMENTS

| | | | |
|---|---|---|---|
| 8,664,538 B2* | 3/2014 | Kim ................... | H01L 21/6835 |
| | | | 174/260 |
| 2002/0064029 A1* | 5/2002 | Pohjonen ............ | H01L 23/3677 |
| | | | 361/719 |
| 2004/0157410 A1* | 8/2004 | Yamaguchi ....... | H01L 23/49805 |
| | | | 438/460 |
| 2008/0116981 A1* | 5/2008 | Jacobson ............. | H03B 5/1847 |
| | | | 331/17 |

* cited by examiner

BLIND VIA EDGE CASTELLATION

FIELD OF THE INVENTION

The present invention relates to multilevel circuits generally and, more particularly, to a method and/or apparatus for implementing a blind via edge castellation.

BACKGROUND OF THE INVENTION

Conventional land grid array packages often have blind solder joints. Such solder joints cannot be visually inspected and so present a problem. Conventional edge castellations overcome the visual inspection problem by running platings in vias on an outside edge of the package. The solder joints made to the platings are visible. For high-frequency signals used in radio frequency circuits, the edge castellations act like transmission line stubs. Some edge castellations add such sufficient loss to the high-frequency signals that the edge castellations cannot be implemented.

It would be desirable to implement a blind via edge castellation.

SUMMARY OF THE INVENTION

The present invention concerns an apparatus having a plurality of insulating layers, a plurality of conductive layers and a plating. The conductive layers may be separated by the insulating layers. A first pattern in a first of the conductive layers generally extends to an edge castellation. A second pattern in a second of the conductive layers may also extend to the edge castellation. The plating may be disposed in the edge castellation and connect the first pattern to the second pattern. The plating in the castellation may extend at most between a subset of the conductive layers.

The objects, features and advantages of the present invention include providing a blind via edge castellation that may (i) support a visually inspectible solder joint, (ii) reduce performance degradation, (iii) accommodate high frequency signals, (iv) extend only one or a few layers along an edge of a board and/or (v) be implemented in a land grid array board or substrate.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS various embodiments of the invention generally implement one or more blind edge castellations. The blind edge castellations may extend only one or a few conductive layers up from a bottom of a board. Limiting the height of the blind edge castellations generally reduces parasitics that degrade high-frequency signals conveyed by the blind edge castellations. The blind edge castellations may also permit visual inspection of solder joints created between platings in the blind edge castellations and traces on a mother board.

Figure 1:
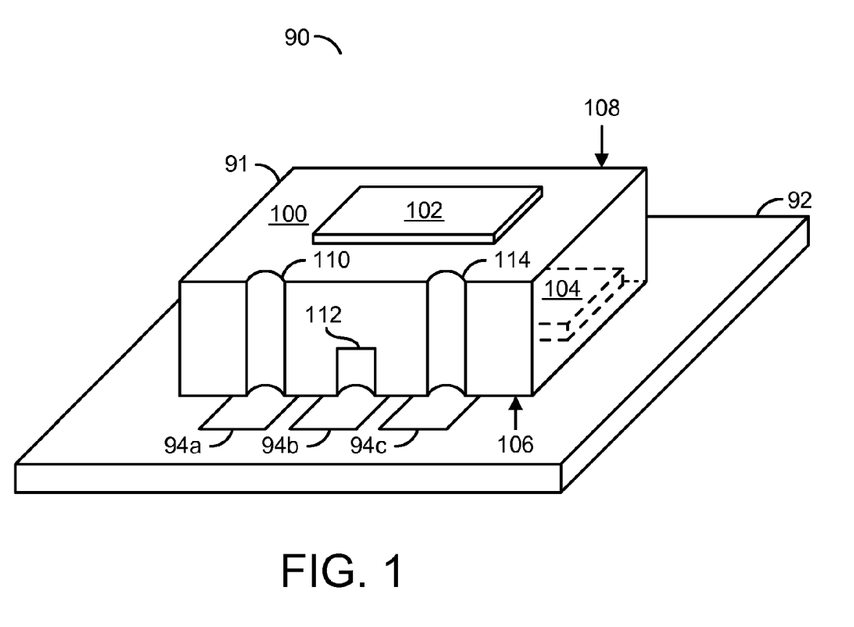
FIG. 1 is a diagram of an example implementation of a device.

Referring to FIG. 1, a diagram of an example implementation of a device 90 is shown. The device (or circuit or component) 90 may implement a packaged radio frequency circuit mounted on a mother board. The device 90 generally comprises a board assembly (or substrate or apparatus) 91 and a mother board (or circuit board) 92. The mother board 92 generally comprises multiple traces (or wires) 94a-94c on a top surface. The board assembly 91 generally comprises a board 100, a heat sink 102 and one or more circuits (or chips or dice) 104. The circuits 104 are generally mounted on a bottom of the board 100. A bottom (or solder side or component side) surface 106 of the board 100 may adjoin (or contact) the top surface of the mother board 92. The heat sink 102 may be mounted to a top surface 108 of the board 100. Multiple plated edge castellations 110-114 may be formed in one or more side edges of the board 100.

Each trace 94a-94c may be aligned to a respective edge castellation 110-114. Solder between the traces 94a-94c and the bottom conductive layer of the board 100 generally flows into the edge castellations 110-114 during fabrication to provide visually inspectible electrical connections (e.g., solder joints) between the mother board 92 and the board 100.

In some embodiments, the board 100 may be a printed circuit board with a land grid array. In other embodiments, the board 100 may be a multilayer ceramic board. The board 100 generally comprises multiple (e.g., three or more) layers of patterned conductors separated by multiple insulating layers. Some of the patterns in the various conductive layers may be interconnected by vias. An outermost (e.g., bottom) conductive layer may include bonding pads to electrically connect to the circuits 104. The outermost conductive layer may also include solder areas used to solder the board 100 to the mother board 92.

The heat sink 102 may be operational to efficiently transfer heat generated by the circuits 104 into the surrounding atmosphere. The heat sink 102 may be finned or un-finned.

The circuits 104 generally comprise radio frequency circuits, passive components and digital drivers. The circuits 104 are operational to transmit and/or receive one or more high-frequency signals and one or more low-frequency signals to and from the mother board 92. The circuit 104 may also receive one or more power signals and one or more ground signals from the mother board 92. A high-frequency signal may be carried between the mother board 92 and the board 100 via the edge castellation 112. The low-frequency signals, power and ground may be transferred via the edge castellations 110 and 114.

The high-frequency signals generally comprise signals having a frequency above approximately 1 gigahertz (e.g., GHz). The high-frequency signals may be routed through the short edge castellation 112 instead of the long edge castellations 110 and 114 to avoid attenuations due to the open-circuited transmission line stub characteristics that may be present in the long edge castellations 110 and/or 114.

The low-frequency signals generally comprise signals having a frequency below approximately 500 megahertz (e.g., MHz). The low-frequency signals may be conveyed through the edge castellations 110 and/or 114 because the attenuations, if any, are not a factor in a performance of the circuit 104. Signals having intermediate frequencies are generally routed on edge castellations 110, 112 or 114 depending on the nature of the signal and a susceptibility to the stub-like characteristics of the edge castellations 110 and 114.

Figure 2:
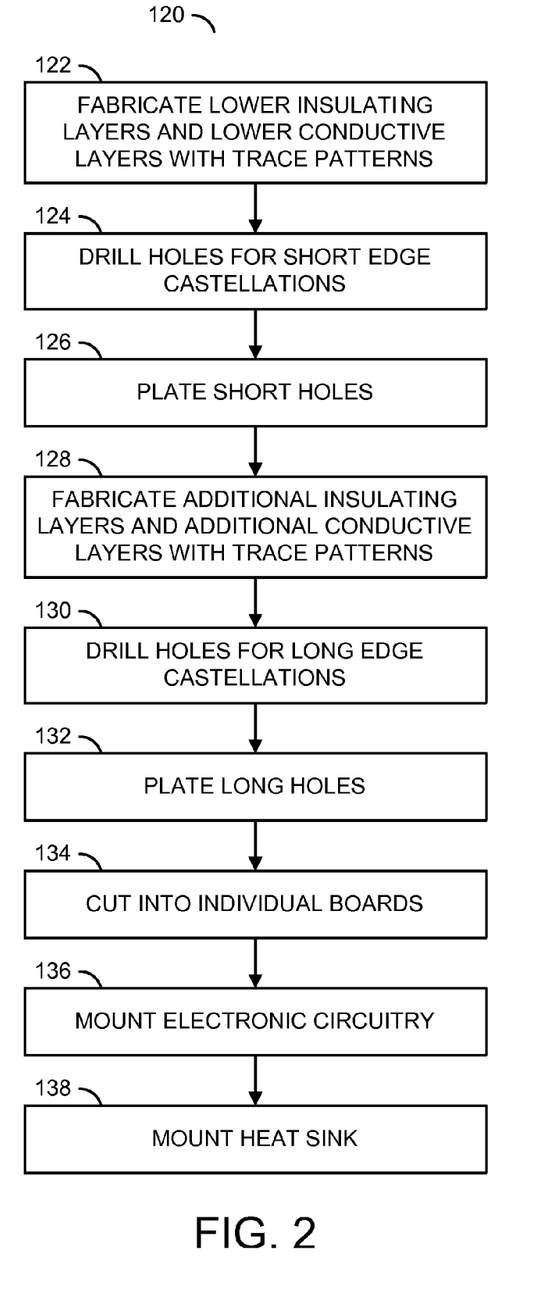
FIG. 2 is a flow diagram of a method for fabricating a board assembly.

Referring to FIG. 2, a flow diagram of an example implementation of a method 120 for fabricating the board assembly 91 is shown. The method (or process) 120 generally comprises a step (or state) 122, a step (or state) 124, a step (or state) 126, a step (or state) 128, a step (or state) 130, a step (or state) 132, a step (or state) 134, a step (or state) 136 and a step (or state) 138. The method 120 may be performed in a normal circuit board fabrication facility using normal fabrication techniques.

In the step 122, a lower portion of a package substrate (or multilayer ceramic substrate) may be created by laminating (or layering or depositing) a single or multiple insulating layers and multiple conductive layers. Each conductive layer is generally patterned before being covered by a subsequent insulating layer. The layering sequence generally begins at a bottom surface of the package substrate (e.g., what will become the bottom surface 106 of the board 100) with a bottom conductive layer (e.g., layer 1) and progresses upward.

After two or more of the conductive layers have been assembled, holes (or vias) for the short edge castellations (e.g., 112) may be drilled in the partially-fabricated package substrate in the step 124. The holes may be referred to as short holes. The short holes may be plated in the step 126 with a conductive material. The conductive material electrically connects to each pattern of each conductive layer intersected by the short holes. In the step 128, the laminating of more insulating layers and more conductive layers may continue until the top surface of the package substrate (e.g., what will become the top surface 108 of the board 100) has been added. After each conductive layer is added, the conductive layer is patterned.

In the step 130, more holes (or vias) are created in the package substrate. The holes created in the step 130 generally pass through all of the conductive layers and all of the insulating layers of the package substrate and so may be referred to as long holes. Plating of the long holes with the conductive material may be performed in the step 132. The conductive material electrically connects to each pattern of each conductive layer intersected by the long holes. The connections may include one or more of the conductive layers. In contrast, the plating in the short holes is limited to one or more of the lower conductive layers that were present when the short holes were formed. In some embodiments, both the short holes and the long holes may be plated at the same time if the plating technique being used can deposit into the close-ended short holes.

In the step 134, the package substrate may be cut into individual boards. The circuits 104 are generally mounted into the boards in the step 136 and electrically connected to bonding pads formed in one or more of the conductive layers (e.g., wire bonds, soldering, tab bonds, ball grid arrays, or the like). After the circuits 104 have been sealed, the heat sink 102 may be added in the step 138 to create the board assembly 91.

Figure 3:
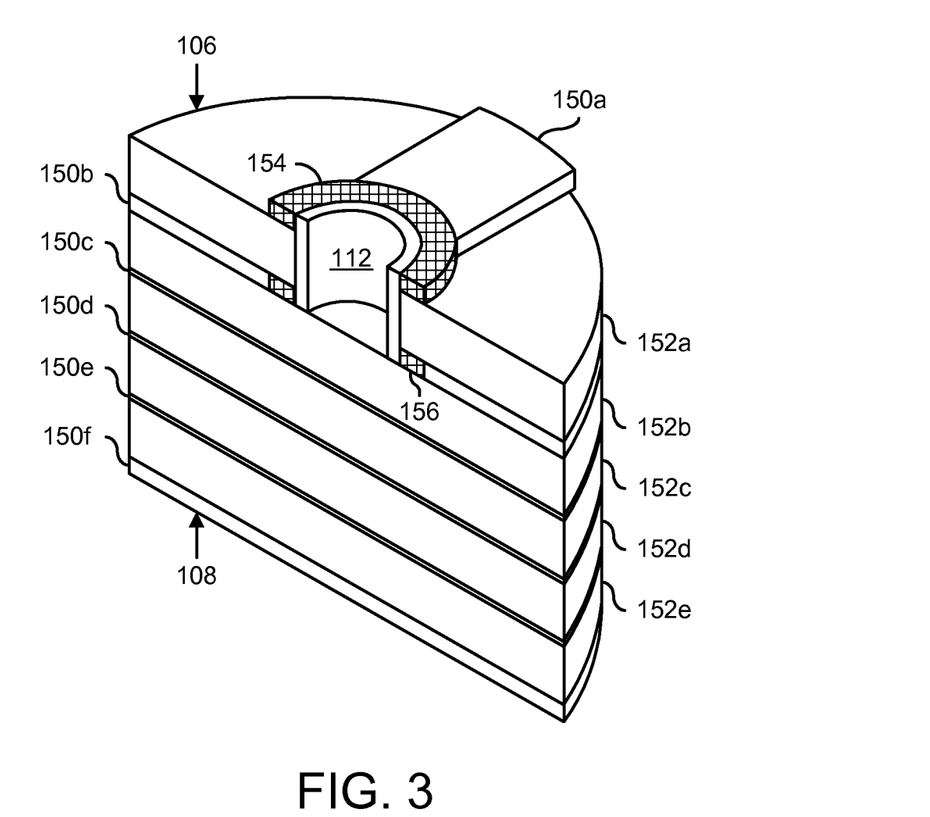
FIG. 3 is a cutaway perspective diagram of a portion of a board in accordance with a preferred embodiment of the present invention.

Referring to FIG. 3, a cutaway perspective diagram of an example embodiment of a portion of the board 100 is shown in accordance with a preferred embodiment of the present invention. An orientation of the board 100 shown in FIG. 3 is flipped 180 degrees from the orientation shown in FIG. 1. The portion is focused on the short edge castellation 112.

The board 100 generally comprises multiple conductive layers 150a-150f. In some embodiments, all of the conductive layers 150a-150f may have a uniform thickness. In other embodiments, the different conductive layers 150a-150f may have different thicknesses.

One or more insulating layers 152a-152e are provided between each neighboring pair of the conductive layers 150a-105f. In some embodiments, all of the insulating layers 152a-152e may have a uniform thickness. In other embodiments, the different insulating layers 152a-152e may have different thicknesses. The bottom conductive layer 150a on the solder (or bottom) side 106 of the board 100 is generally an outermost layer. As illustrated, the top conductive layer 150f top side 108 of the board 100 is generally an outermost layer. In some embodiments, the outermost layer on the top side 108 may be an insulating layer.

The short edge castellation 112 is generally formed where the short hole intersects the patterns on one or more of the lower conductive layers (e.g., 150a-150b). The pattern on each conductive layer 150a-150b that makes electrical contact with the plating in the short edge castellation 112 has a respective annular pattern. When the package substrate is cut (e.g., the step 134 in FIG. 2), the resulting semi-annular patterns form pads 154-156. A plating deposited (e.g., the step 126 in FIG. 2) provides an electrical connection between the pads 154-156.

In many embodiments, the pad 154 in the bottom conductive layer 150a is connected to a trace that carries a high-frequency signal related to the circuit 104. The pad 156 is generally isolated from the rest of the pattern(s) in the next conductive layer 150b. In some embodiments, the pad 156 may also be connected to a trace to convey the signal passing through the short edge castellation 112 to another area in the board 100. A shortness of the inter-layer length of the short' edge castellation 112 generally helps reduce stub-like characteristics (e.g., incident wave reflections and/or inversions) that may contribute to the attenuation and/or distortion of the high-frequency signals.

Figure 4:
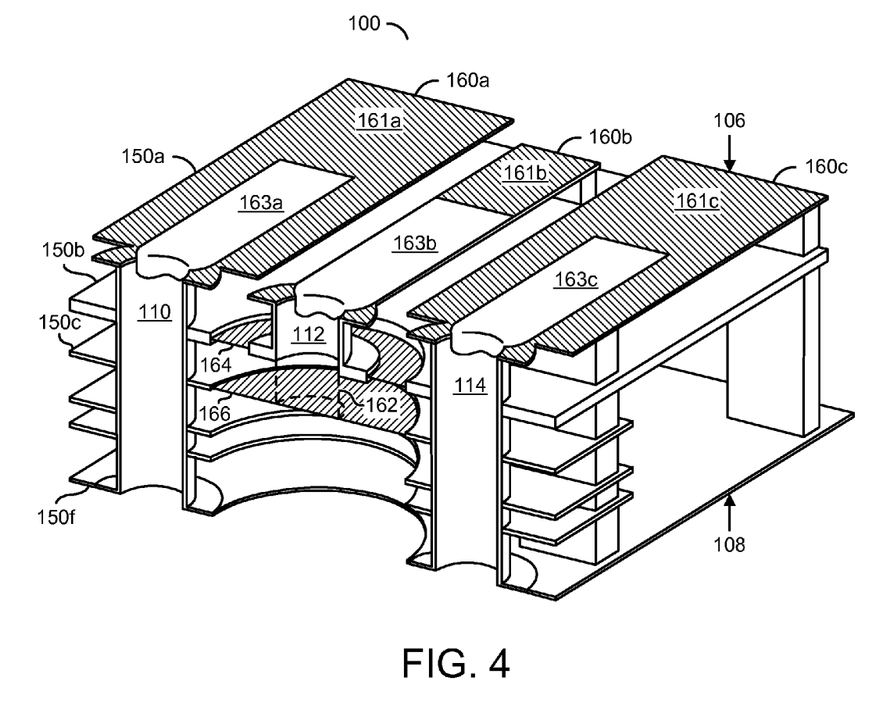
FIG. 4 is a cutaway perspective diagram of an example embodiment of the board.

Referring to FIG. 4, a cutaway perspective diagram of an example embodiment of the board 100 is shown. An orientation of the board 100 shown in FIG. 4 is flipped 180 degrees from the orientation shown in FIG. 1. The conductive layer 150a is generally patterned into multiple traces 160a-160c. Each trace 160a-160c connects to a respective pad of a respective edge castellation 110-114 (e.g., 160a is shown connected to 110, 160b is shown connected to 112 and 160c is shown connected to 114).

A dielectric layer is generally formed on the traces 160a-160c. The dielectric layer may be patterned into solder masks 161a-161c over areas that should avoid contact with the solder. The solder is deposited into solder areas 163a-163c to permit the traces 160a-160c to be soldered to the respective traces 94c-94a on the mother board 92. Some of the solder may flow onto the castellations 110, 112 and 114 during the mounting step (e.g., the step 136 in FIG. 2). The solder that extends onto the castellations 110, 112 and 114 enables visual inspection of the resulting solder joints.

An embodiment of the short edge castellation 112 as shown is only connected to the trace (or pattern) 160b in the bottom conductive layer 150a. The pattern formed in the next conductive layer 150b includes a non-conductive area (or insulating area or gap) 164 that electrically isolates the short edge castellation 112 from the rest of the conductive layer 150b. The electrical isolation helps reduce parasitics (e.g., capacitances, resistances and/or inductances) that contribute to the attenuation and/or distortion of the signal in the trace 160b. Similar non-conductive areas may be created in one or more of the conductive layers (e.g., 150c-150f) aligned with the short edge castellation 112. For example, a non-conductive area (or insulating area or gap) 166 is shown created in the intermediate conductive layer 150c aligned about a half-cylinder 162 defined by the short edge castellation 112. Additional insulating gaps similar to the non-conductive area 166 may be formed in one or more of the other conductive layers 150d-150f between the top of the short edge castellation 112 and the top 108 of the board 100. The non-conductive area(s) 166 may also help reduce parasitics between the short edge castellation 112 and the other conductive layers 150c-150f.

Figure 5:
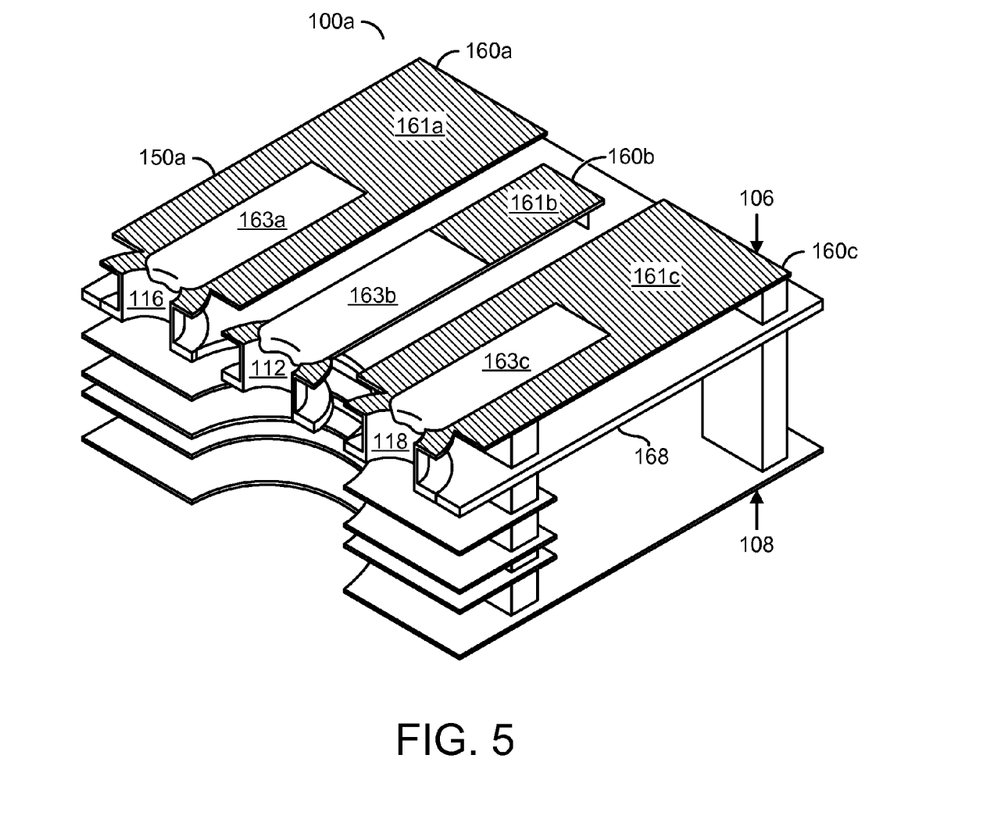
FIG. 5 is a cutaway perspective diagram of another example embodiment of the board.

Referring to FIG. 5, a cutaway perspective diagram of another example embodiment of a board 100a is shown. The board 100a may be a variation of the board 100. Elements with common reference numbers generally refer to the same elements in both embodiments. The board 100a may be implemented with all short edge castellations 112, 116 and 118. The steps in the method 120 used to create the long edge castellations 110 and 114 of the board 100 may be skipped when fabricating the board 100a.

Figure 6:
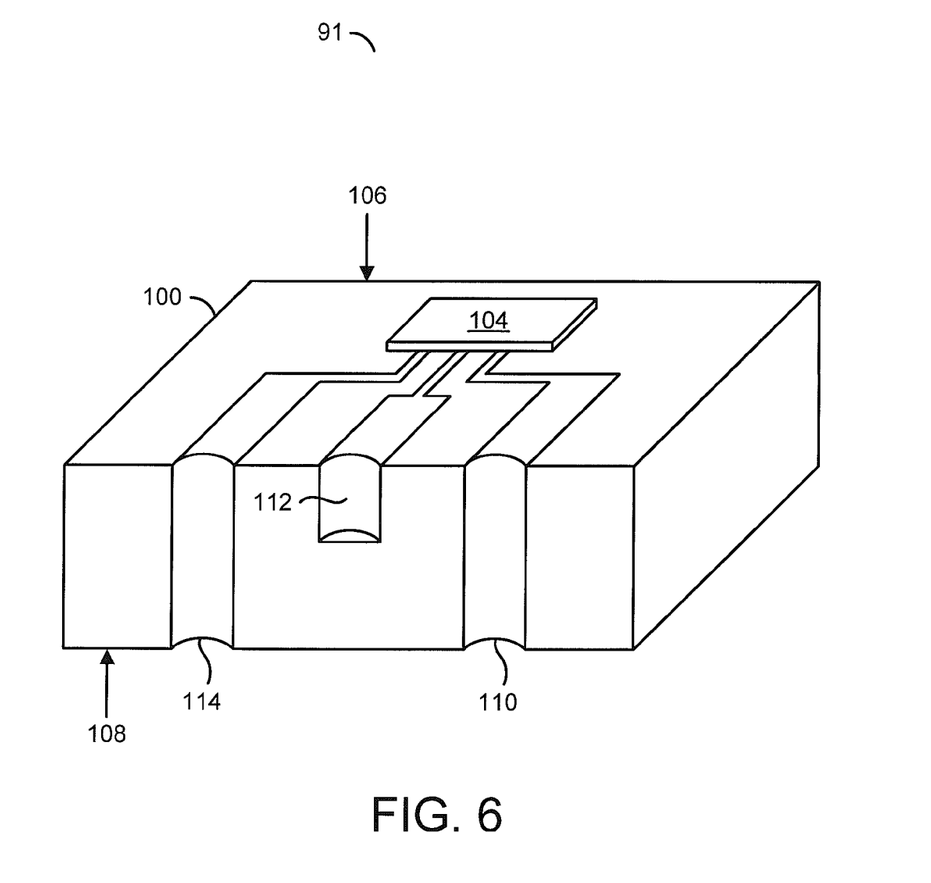
FIG. 6 is a perspective diagram of the board showing a bottom surface.

Referring to FIG. 6, a perspective diagram of the board assembly 91 showing the bottom surface 106 is illustrated. The circuits 104 (a single circuit 104 is illustrated for simplicity) are generally mounted on the bottom surface 106 of the board 100. The circuits 104 may be electrically connected (e.g., wire bonds, soldering, tab bonds, ball grid arrays, or the like) to bonding pads formed in the one or more of the conductive layers 150a-150f (e.g., the outer layer 150a).

Use of all short edge castellations 112, 116 and 118 generally permits a simple board fabrication technique, eliminating the separate step of creating the long castellations. Since all of the edge castellations of the board 100a have the same height, the soldering process and visual inspection criteria of each short edge castellation 112, 116 and 118 may be the same.

Similar to the long edge castellations 110 and 114 of the board 100, some short edge castellations (e.g., 116 and 118) of board 100a may be used to carry signals between the lower conductive layers (e.g., 150a-150b). The pads (e.g., 154 and 156 in FIG. 3) formed in the patterns of the conductive layer 150b may be connected to one or more traces 168 that carry the signals to other areas of the conductive layer 150b. As such, some short edge castellations (e.g., 118) may be used for inter-conductive layer connections and/or connections to the mother board 92.

The functions and structures illustrated in the diagrams of FIGS. 1-6 may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a substrate comprising a plurality of insulating layers and a plurality of conductive layers separated by said insulating layers, wherein (i) a first pattern in a first of said conductive layers extends to an edge castellation in said substrate, (ii) a second pattern in a second of said conductive layers extends to said edge castellation and (iii) said first conductive layer is on a solder side of said substrate;
   a plating disposed in said edge castellation that connects said first pattern to said second pattern, wherein said plating in said edge castellation extends at most between a subset of said conductive layers;
   a circuit mounted on said substrate from said solder side and electrically connected to said edge castellation; and
   a solder layer disposed on said first conductive layer and configured to (i) flow into said edge castellation and (ii) attach said substrate to a surface of a motherboard, wherein said first conductive layer is parallel to said surface of said motherboard when said substrate is attached to said motherboard.

2. The apparatus according to claim 1, further comprising an additional plating in an additional edge castellation that extends between two outermost layers of said conductive layers.

3. The apparatus according to claim 2, wherein said additional plating in said additional edge castellation carries a low frequency signal.

4. The apparatus according to claim 3, wherein a frequency of said low frequency signal is below 500 megahertz.

5. The apparatus according to claim 1, further comprising one or more additional edge castellations and respective platings that extend at most between said subset of said conductive layers.

6. The apparatus according to claim 1, wherein one or more of said conductive layers comprise a non-conductive area aligned to a half-cylinder defined by said edge castellation.

7. The apparatus according to claim 1, wherein said second pattern comprises (i) a pad connected to said plating and (ii) a non-conductive area that isolates said pad from a rest of said second pattern.

8. The apparatus according to claim 1, wherein said second pattern comprises (i) a pad connect to said plating and (ii) a trace connected to said pad.

9. The apparatus according to claim 1, wherein said first conductive layer is an outermost one of said conductive layers on said solder side of said substrate.

10. The apparatus according to claim 1, wherein said first pattern and said second pattern are separated by at most one of said insulating layers.

11. The apparatus according to claim 1, wherein said plating in said edge castellation carries a high frequency signal.

12. The apparatus according to claim 11, wherein a frequency of said high frequency signal is above one gigahertz.

13. The apparatus according to claim 12, wherein a length of said edge castellation is configured to reduce stub-like characteristics of said plating on said high frequency signal.

14. The apparatus according to claim 1, wherein said substrate comprises one of (i) a printed circuit board and (ii) a multilayer ceramic board.

15. The apparatus according to claim 1, wherein a joint formed by said solder layer in said edge castellation is visually inspectible after said substrate is attached to said motherboard.

16. The apparatus according to claim 1, further comprising a heat sink mounted on another side of said substrate opposite said solder side of said substrate.

17. The apparatus according to claim 1, wherein said first pattern in said first conductive layer comprises a land gird array.

18. The apparatus according to claim 1, wherein all castellations in said substrate extend through said first conductive layer.

19. The apparatus according to claim 1, wherein at least two of said conductive layers have different thicknesses.

20. A method of communicating a signal, comprising the steps of:
   generating said signal in a circuit, wherein (i) said circuit is mounted on a substrate from a solder side of said substrate and is electrically connected to an edge castellation, (ii) said substrate comprises a plurality of insulating layers and a plurality of conductive layers separated by said insulating layers, a first pattern in a first of said conductive layers extends to said edge castellation in said substrate, a second pattern in a second of said conductive layers extends to said edge castellation, and said first conductive layer is on said solder side of said substrate, (iii) a plating is disposed in said edge castellation that connects said first pattern to said second pattern and said plating in said edge castellation extends at most between a subset of said conductive layers, (iv) a solder layer is disposed on said first conductive layer and is configured to flow into said edge castellation and attach said substrate to a surface of a motherboard, and (v) said first conductive layer is parallel to said surface of said motherboard when said substrate is attached to said motherboard; and
   transferring said signal through said first pattern in said first conductive layer, said plating in said edge castellation and said solder layer to said motherboard.

21. A method for fabricating an apparatus, comprising:
   fabricating a substrate comprising a plurality of insulating layers and a plurality of conductive layers separated by said insulating layers, wherein (i) a first pattern in a first of said conductive layers extends to an edge castellation in said substrate, (ii) a second pattern in a second of said conductive layers extends to said edge castellation and (iii) said first conductive layer is on a solder side of said substrate;
   fabricating a plating disposed in said edge castellation that connects said first pattern to said second pattern, wherein said plating in said edge castellation extends at most between a subset of said conductive layers;
   mounting a circuit on said substrate from said solder side and electrically connected to said edge castellation; and
   fabricating a solder layer disposed on said first conductive layer and configured to (i) flow into said edge castellation and (ii) attach said substrate to a surface of a motherboard, wherein said first conductive layer is parallel to said surface of said motherboard when said substrate is attached to said motherboard.

22. The method according to claim 21, further comprising:
   fabricating an additional plating in an additional edge castellation that extends between two outermost layers of said conductive layers.

23. The method according to claim 21, further comprising:
   fabricating one or more additional edge castellations and respective platings that extend at most between said subset of said conductive layers.

24. The method according to claim 21, wherein one or more of said conductive layers comprise a non-conductive area aligned to a half-cylinder defined by said edge castellation.

25. The method according to claim 21, wherein said second pattern comprises (i) a pad connected to said plating and (ii) a non-conductive area that isolates said pad from a rest of said second pattern.

26. The method according to claim 21, wherein said second pattern comprises (i) a pad connect to said plating and (ii) a trace connected to said pad.

27. The method according to claim 21, wherein said first conductive layer is an outermost one of said conductive layers on said solder side of said substrate.

28. The method according to claim 21, wherein said first pattern and said second pattern are separated by at most one of said insulating layers.

29. The method according to claim 21, wherein said plating in said edge castellation carries a high frequency signal.

* * * * *